United States Patent
Akram et al.

(10) Patent No.: US 6,169,021 B1
(45) Date of Patent: Jan. 2, 2001

(54) METHOD OF MAKING A METALLIZED RECESS IN A SUBSTRATE

(75) Inventors: Salman Akram; John R. C. Futrell, both of Boise; Steven M. McDonald, Meridan, all of ID (US)

(73) Assignee: Micron Technology, Inc., Boise, ID (US)

(*) Notice: Under 35 U.S.C. 154(b), the term of this patent shall be extended for 0 days.

(21) Appl. No.: 09/216,661

(22) Filed: Dec. 18, 1998

Related U.S. Application Data

(62) Division of application No. 09/110,554, filed on Jul. 6, 1998.

(51) Int. Cl.[7] .................................................. H01L 21/44
(52) U.S. Cl. .......................... 438/612; 438/14; 438/15; 438/613; 438/614; 438/702; 438/106
(58) Field of Search ................................ 438/597, 689, 438/945, 640, 673, 701, 702, 612, 613, 614, 14, 15, 106

(56) References Cited

U.S. PATENT DOCUMENTS

| | | | |
|---|---|---|---|
| 5,020,283 | 6/1991 | Tuttle | 51/209 |
| 5,478,438 * | 12/1995 | Nakanishi et al. | 156/647.1 |
| 5,494,853 | 2/1996 | Lur | 437/195 |
| 5,578,518 | 11/1996 | Koiko et al. | 437/67 |
| 5,668,401 | 9/1997 | Chao et al. | 257/620 |
| 5,702,985 | 12/1997 | Burns | 437/217 |
| 5,719,446 | 2/1998 | Taguchi et al. | 257/751 |
| 5,780,346 | 7/1998 | Arghavani et al. | 438/296 |
| 5,795,823 * | 8/1998 | Avanzino et al. | 438/639 |
| 5,814,557 | 9/1998 | Venkatraman et al. | 438/622 |
| 5,821,169 * | 8/1998 | Nguyen et al. | 438/736 |
| 5,827,781 | 10/1998 | Skrovan et al. | 438/693 |
| 5,933,758 | 8/1999 | Jain | 438/687 |
| 5,935,762 | 8/1999 | Dai et al. | 430/312 |
| 5,962,921 | 10/1999 | Farnworth et al. | 257/773 |

* cited by examiner

*Primary Examiner*—Caridad Everhart
(74) *Attorney, Agent, or Firm*—Workman, Nydegger & Seeley

(57) ABSTRACT

The present invention relates to the formation of a ball grid array testing receiver that is scalable for design consideration of miniaturization. A dielectric layer is formed upon a substrate that is substantially conformal to the upper surface of the substrate. A patterned masking layer is formed upon the dielectric layer and a subsequent etch forms a depression within the substrate and forms a ledge on the surface of the substrate that is adjacent to the depression. After formation of the ledge, a metal layer is formed continuously on the ledge and within the depression. Following the formation of the metal layer, a masking layer is formed upon the metal layer. The masking layer is patterned so as to form a desired arrangement of metal lines by etching the underlying metal layer. The formation of the ledge enables the masking layer to resist formation of a breach between the surface of the substrate and the depression. As such, metal lines are formed so as to extend into the depression without a breach that would otherwise leave an open circuit during attempted use.

39 Claims, 7 Drawing Sheets

METHOD OF MAKING A METALLIZED RECESS IN A SUBSTRATE

BACKGROUND OF THE INVENTION

This application is a divisional of U.S. application Ser. No. 09/110,554, filed on Jul. 6, 1998, which is incorporated herein by reference.

1. The Field of the Invention

The present invention relates to patterning techniques in the microelectronics industry. More particularly, the present invention relates to photolithographic techniques for preserving a substantially uniform layer upon a substrate topology. In particular, the present invention relates to methods of patterning and etching trenches and pits and forming a continuous layer that electrically communicates out of the trench or pit to an upper surface. The method is carried out after a manner that avoids nonuniformities of the continuous layer that communicates out of the trench or pit to an upper surface.

2. The Relevant Technology

In the microelectronics industry, a substrate refers to one or more semiconductor layers or structures which includes active or operable portions of semiconductor devices. In the context of this document, the term "semiconductive substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term substrate refers to any supporting structure including but not limited to the semiconductive substrates described above. The term semiconductor substrate is contemplated to include such structures as silicon-on-insulator, silicon-on-sapphire, and the like.

In the field of chip packaging, a goal for those skilled in the art is to miniaturize the chip package, such as in chip scale packages (CSP) where the package itself is only about 1–2 times the size of the chip. Various methods have been proposed to eliminate wire bonding and to achieve lead on chip (LOC) wiring as a means of decreasing chip packaging size. Traditionally, connections have been achieved by connecting a bonding wire from a bonding pad on the chip to a lead finger. However, wire bonding is time consuming and costly, particularly as the number of inputs and outputs from a single chip increases. As integrated circuit technology advances, other methods of connecting input and output from a chip to the external world must be explored to facilitate miniaturization. New packages such as CSP, ball grid array (BGA) packages and flip chips have all been developed as methods of miniaturizing chip packages. In a BGA, solder balls, also called solder bumps, or electrically conductive prominences, are generally intended to all be of substantially the same size. For example, the solder balls may be about 0.3 to 0.4 millimeters in diameter and contact the die bond pads through the bottom of the package surface. Generally an array of electrical contacts congruent to the solder ball array is to be found on a circuit board to which the package containing the solder balls is to be mounted. The solder balls individually contact their corresponding pads on a printed circuit board (PCB). In order to assure adequate contact, solder paste is often required to accommodate for variations and discrepancies between solder ball sizes and solder ball locations. After contact, the circuit board and the chip are placed in a solder reflow furnace under conditions sufficient to cause the solder ball to reflow and coalesce within the solder paste in order to form an adequate electrical connection.

Conventionally, solder bump reflowing is used to mount a chip or chip package onto a PCB. A degree of dimensional variation occurs with solder bumps in the prior art. Reliability in the mounting and electrical connection of integrated circuit packages to their mounting boards is important because the solder joints between the contacts of the chip and those of the PCB are highly difficult to visually inspect and non-destructively test once the chip is in place on the PCB. Although statistical methods of quality control along with destructive testing methods must be relied upon to provide confidence that reliable electrical connections are being made, more effective methods are being sought.

Prior to mounting of integrated circuit packages to their mounting boards, it is important and often indispensable that testing of the chip package is carried out. In particular, testing under adverse conditions, called "burn-in" must be conducted. Testing must be carried out before the final mounting of a chip package to a PCB. Accordingly, testing structures have been made that are electrically conductive and that are configured to match the BGA of the chip package.

As design efforts that emphasize miniaturization continue, the making of a testing structure that receives and electrically connects with the bumps of a BGA package become increasingly challenging. Formation of a testing array can be carried out according to standard photolithographic techniques. With miniaturization, however, fabrication problems arise.

FIG. 1 is an elevational cross-section view of a semiconductor structure 10. Semiconductor structure 10 comprises a substrate 12, a metal layer 14, and a masking layer 16 according to the prior art. It can be seen that masking layer 16 covers portions of metal layer 14 including coverage of an upper surface 24 of substrate 12. Masking layer 16 is also over a pit surface 26 of substrate 12 within a pit 20 into which metal layer 14 has been formed.

Due to various processing parameters, a breach 18 can be seen in masking layer 16. Breach 18 may be formed due to the presence of a sharp corner 22 on an upper surface 24 of substrate 12. Sharp corner 22 causes substantial thinning of masking layer 16 during formation thereof. Additionally, breach 18 may be caused by mechanical action of a process performed upon masking layer 16, exacerbated because of the thinness of masking layer 16 at sharp corner 22.

Where metal layer 14 is used as an electrical contact for testing a BGA upon a chip package or the like, masking layer 16 is patterned in order to achieve a substantially continuous electrically conductive structure comprising metal layer 14. During CSP or flip chip testing, through electrical conductivity of a BGA, it is preferable that metal layer 14 within pit 20 be in uninterrupted electrical communication with other portions of metal layer 14 that form metal lines (now shown). Patterning of masking layer 16 is carried out in order to form distinct and separate electrical contacts within pit 20 that also run along upper surface 24 of substrate 12.

FIG. 2 illustrates the prior art result of thinning of masking layer 16 (not shown) due to the presence of sharp corner 22 after a patterning etch of metal layer 14 to form metal lines. Semiconductor structure 10 includes substrate 12 and a broken metal line 28 that was formed from metal layer 14. Typically, there is a dielectric between substrate 12 and metal layer 14, particularly where substrate 12 may be electrically conductive or semiconductive. Broken metal line 28 exists both upon upper surface 24 of substrate 12 and upon pit surface 26 of pit 20 within substrate 12. An individual solder ball, bump, or the like is to be inserted within pit 20 during testing. Problematically, no electrical contact can be made from broken metal line 28 within pit 20 to upper surface 24 of substrate 12. Consequently, no electrical testing of the chip package can be carried out due to the existence of a breach 30 in broken metal line 28. Additionally, where breach 30 is not formed during fabrication, breach 30 may form during use, where metal layer 14 may have been thinner near sharp corner 22 due to thinning of masking layer 16 instead of the formation of a breach thereof.

What is needed in the art is a method of forming a BGA testing receiver that does not suffer from the problems of the prior art. What is also needed in the art is a method of forming a testing package for a semiconductor chip package that resists formation of broken metal line 28 despite increasing miniaturization. What is also needed in the art is a method of forming a BGA testing receiver that is manufactured with reduced processing steps.

SUMMARY OF THE INVENTION

The present invention relates to the formation of a ball grid array (BGA) testing receiver that is subject to miniaturization for scalable design. The BGA testing receiver may be known by such terms as a silicon interconnect or an insert. The present invention overcomes the problems of the prior art caused by thinning of a photoresist at a step caused by sharp corners in a substrate.

In a first embodiment of the present invention, a dielectric layer is formed upon a substrate that is substantially conformal to the upper surface of the substrate. A masking layer is formed upon the dielectric layer and patterned in such a way so as to expose a pit and to create a ledge.

After formation of the ledge and optional formation of a sealing dielectric layer, formation of a metal layer is carried out. Preferably, the metal layer is formed of a refractory metal. Following the formation of the metal layer, a masking layer is formed upon the metal layer. Formation of the ledge resists the thinning of the metal line-forming masking layer at regions at or near the sharp corner that leads into the pit.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Reference will now be made to the drawings wherein like structures will be provided with like reference designations. It is to be understood that the drawings are diagrammatic and schematic representations of the embodiment of the present invention and are not drawn to scale.

The present invention relates to the formation of a BGA testing receiver that is subject to miniaturization. The BGA testing receiver may be known by such terms as a silicon interconnect or an insert. The present invention overcomes the problems of the prior art caused by thinning of a photoresist at a step caused by sharp corners in a substrate.

Figure 1:
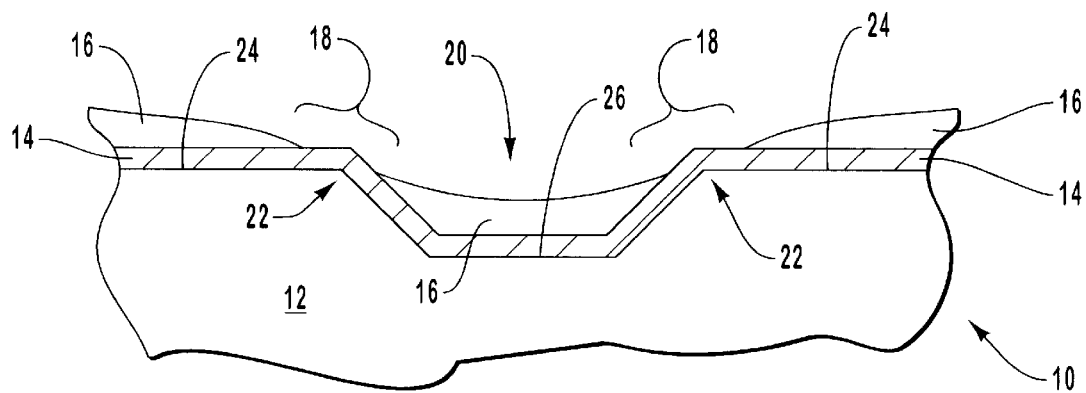
FIG. 1 is an elevational cross-section view of a semiconductor structure according to the prior art, wherein a metal layer has been formed upon a substrate and a masking layer has been formed upon the metal layer with thinning of the masking layer at the areas of sharp corners.
Figure 2:
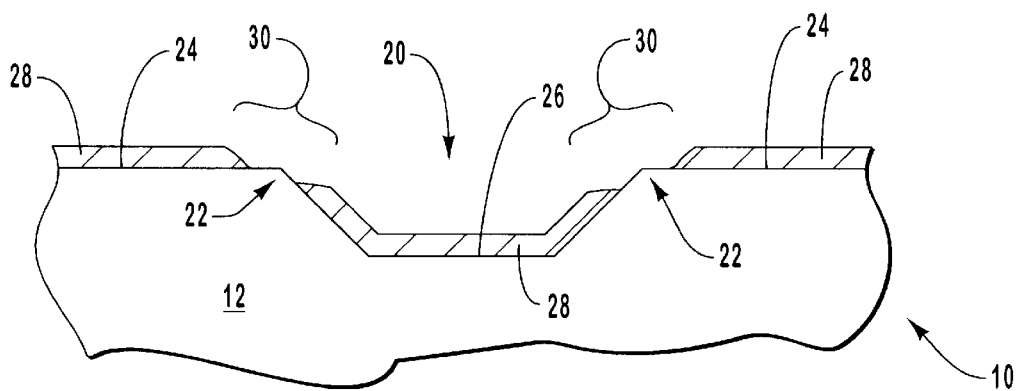
FIG. 2 is an elevational cross-section view of the semiconductor structure depicted in FIG. 1 after further processing, wherein it can be seen that the masking layer has been removed subsequent to an etch that used the masking layer as a pattern, and wherein the metal layer has been breached to form a broken metal line due to the thinning of the masking layer at the location of the sharp corners, as illustrated in FIG. 1.
Figure 3:
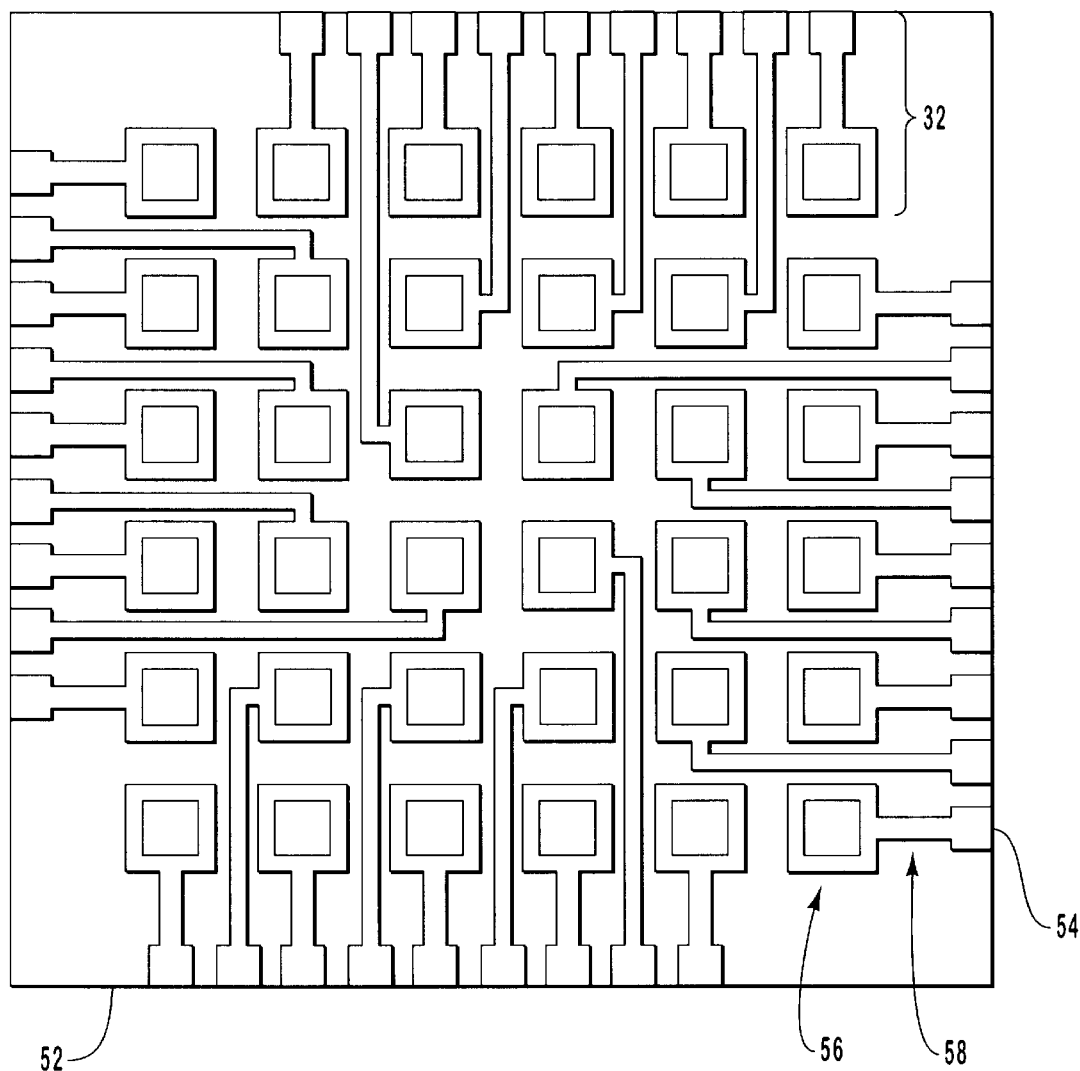
FIG. 3 is a plan view of a BGA testing receiver that includes metallization that runs within each pit in a substrate, and that communicates electrically to a peripheral portion of the BGA testing receiver in order to complete electrical circuits from each pit. External bonding techniques such as wire bonding or tap tape can be used to connect the testing array to the outside.

FIG. 3 is a plan view of a BGA testing receiver 52 that includes metallization within each pit in a substrate and that communicates electrically to a peripheral portion of the BGA-testing receiver in order to complete electrical circuits from each pit. FIG. 3 illustrates what is known in the art as a paddle on pit 20 (not shown). In the plan view, the metallization within a depression in a BGA testing receiver is known as the paddle portion 56. The paddle includes a handle portion that includes a metal line 58 that runs from paddle portion 56 to a peripheral portion 54 of BGA testing receiver 52. Bond pads can be formed at the end of handle portion as shown in FIG. 3. Wire bonding, tab tape, or other electrical connections can be used to connect to the outside circuitry.

The present invention overcomes the problems of the prior art of mask thinning and circuit interruption between pit 20 in BGA testing receiver 52 and metal line 58 that communicates electrically between pit 20 and peripheral portion 54 of BGA testing receiver 52.

Figure 4:
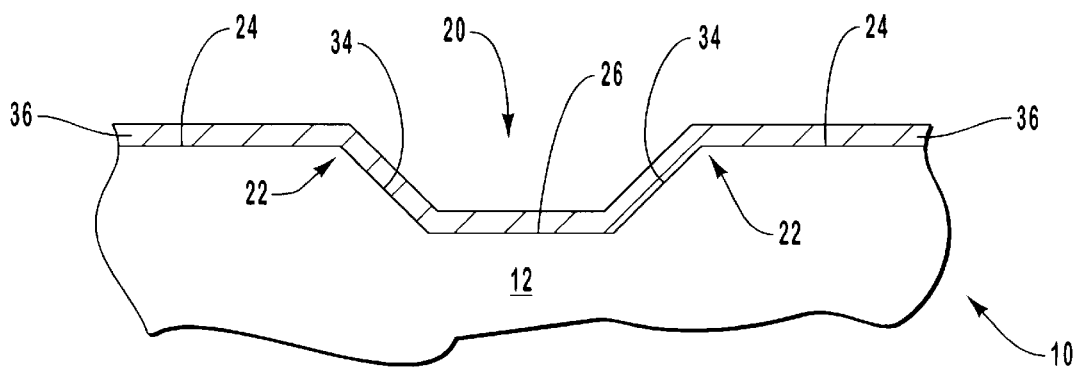
FIG. 4 is an elevational cross-section view of a partially-formed semiconductor structure according to an embodiment of the present invention.

In a first embodiment of the present invention, FIG. 4 illustrates a first step in the inventive method that is used to overcome the problems of the prior art. Substrate 12 may be made from a semiconductive substrate, a dielectric substrate, a layered combination thereof, or the like. Where substrate 12 consists of monocrystalline silicon, the shape of pit 20 may be dictated after a wet etch according to the orientation of the crystal lattice of substrate 12. In FIG. 4, it can be seen that pit 20 has sloping sides 34 due to the existence and orientation of the crystal lattice of substrate 12 where substrate 12 comprises monocrystalline silicon. The presence of vertical sides (not pictured) is likely where substrate 12 is made from a dielectric with no fixed crystal lattice or with an anisotropic dry etch. Additional wet isotropic etches can also be employed including an anisotropic wet etch such as KOH at about 50° C. By this etch, it can form sloping sides 34 as shown in FIG. 4.

FIG. 4 also illustrates processing of semiconductor structure 10 according to the inventive method. In a first embodiment, a dielectric layer 36 is formed upon substrate 12 that is substantially conformal to upper surface 24 of substrate 12, sharp corner 22, sloping sides 34, and pit floor 26 of substrate 12. Formation of dielectric layer 36 may be carried out, by way of nonlimiting example, by thermal oxidation of substrate 12 where substrate 12 is composed of silicon or the like. Additionally, formation of dielectric layer 36 may be carried out by deposition by either chemical vapor deposition (CVD) or physical vapor deposition (PVD). Additionally, dielectric layer 36 may be made by the formation or deposition of nitrides, silicides, carbides and the like. In a preferred embodiment, dielectric layer 36 is made of silicon dioxide, formed by the thermal decomposition of tetra ethyl ortho silicate (TEOS).

Figure 5:
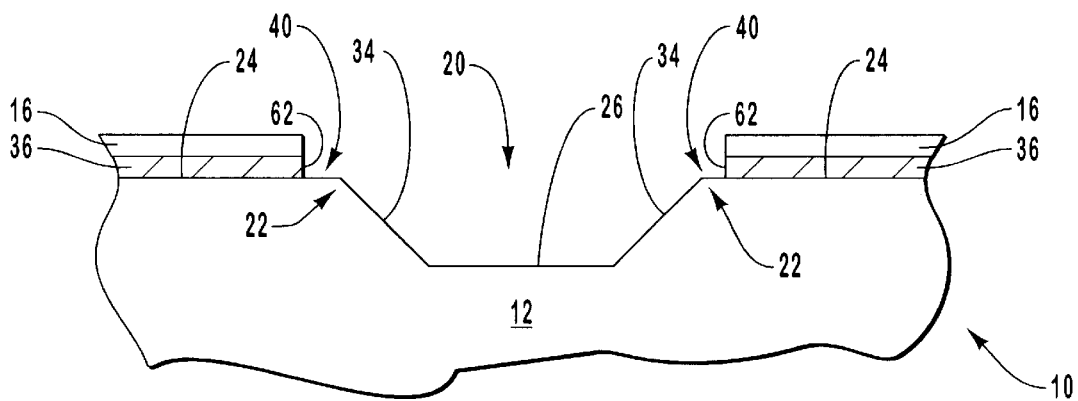
FIG. 5 is an elevational cross-section view of the semiconductor structure depicted in FIG. 4 after further processing, wherein a dielectric layer has been patterned upon the upper surface of the substrate and a pit-exposing masking layer has been patterned upon the dielectric layer. Additionally, the pit-exposing masking layer has been used during removal of a portion of the dielectric layer in regions immediately adjacent to the pit.

FIG. 5 illustrates further processing of semiconductor structure 10 depicted in FIG. 4. A masking layer 16 has been formed upon dielectric layer 36 and patterned in such a way so as to expose pit 20 after a fashion that, following etching of dielectric layer 36 with an etch recipe that may be firstly selective to substrate 12 and secondly selective to masking layer 16, a ledge 40 forms that exposes a portion of upper surface 24 of substrate 12 adjacent to pit 20.

Dimensions of semiconductor structure 10 according to the present invention depend upon the particular and specific application thereof. In general, the depth of pit 20 from upper surface 24 of substrate 12 down to pit floor 26 of substrate 12 is in the range from about 1 micron to about 300 microns. However, pit 20 may be deeper than 300 microns to accommodate a larger solder ball. Preferably the depth of pit 20 is in the range from about 5 microns to about 200 microns, more preferably about 10 microns to about 150 microns, and most preferably about 25 microns to about 100 microns.

The width of ledge 40 from sharp corner 22 to the edge 62 of dielectric layer 36 is in a range from about 0.2 microns to about 25 microns, preferably from about 0.5 to about 20 microns, more preferably from about 0.8 microns to about 10 microns, and most preferably from about 1 micron to about 5 microns. The height of dielectric layer 36, or of edge 62 is preferably in a range from about 1 to about 20 microns, although it may be greater than 20 microns depending upon the application. Ledge widths greater than 25 microns are used with multiple ledges and/or corners having an angle less than that of sharp corner 22. Any combination of disclosed pit depth range, a disclosed height of edge 62 of dielectric layer 36, and a disclosed ledge width is contemplated.

Figure 6:
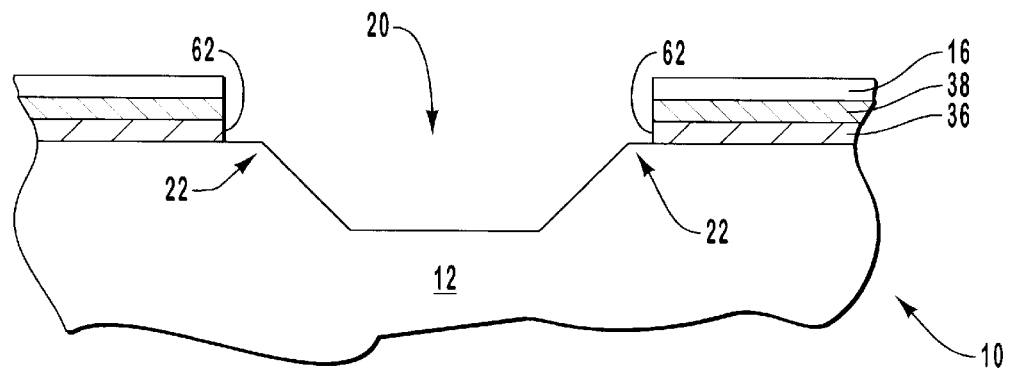
FIG. 6 is an elevational cross-section view of a semiconductor structure formed according to an alternative embodiment of the present invention, wherein a plurality of ledges are to be formed.

An alternative embodiment of the present invention includes forming a plurality of ledges in order to overcome the problems of prior art. FIG. 6 illustrates a first step where dielectric layer 36 and a second dielectric layer 38 have been patterned by masking layer 16 by use of an anisotropic dry etch. Additionally, pit 20 has been formed by an etch that is selective to substrate 12.

Figure 7:
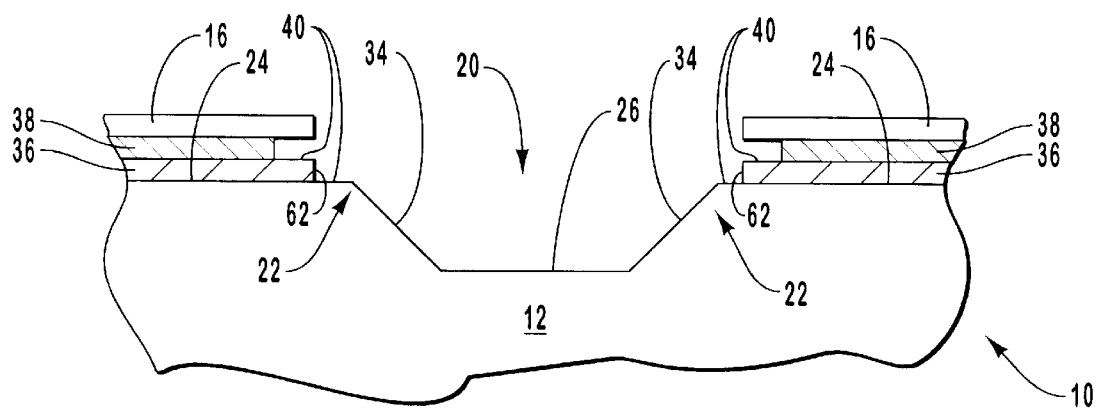
FIG. 7 is an elevational cross-section view of the semiconductor structure depicted in FIG. 6 wherein a first ledge has been formed by an anisotropic etch and a second ledge has been formed by an isotropic etch, the etch recipe of which is selective to the materials forming the substrate, the mask and the first ledge.

FIG. 7 illustrates further processing of semiconductor structure 10 depicted in FIG. 6. Following the anisotropic dry etch, a second etch is carried out that is isotropic. The second etch could be a wet isotropic etch. The second etch may be selective to masking layer 16, dielectric layer 36, and substrate 12 but may not selective to second dielectric layer 38. Thereby, an undercut may form beneath masking layer 16 and ledge 40 is created both upon a portion of upper surface 24 of substrate 12 and upon a portion of dielectric layer 36 within the undercut. Thereby, ledge 40 comprises two topology steps, using a single masking layer 16.

It can be appreciated that a series of ledges may be created according to this alternative embodiment, wherein dielectric layers are selected and etch recipes are employed in etches that are variously selective to different dielectric layers, beginning with dielectric layer 36. In general, this method of forming a semiconductor device comprises forming in succession, a plurality of dielectric layers upon an upper surface of a substrate. For this method, each subsequent-formed dielectric layer has a chemical quality that is different from the previous-formed dielectric layer. After the plurality of dielectric layers are formed, a depression may be formed through the plurality of dielectric layers with a first etch. The first etch may include etching into the substrate or the etch can stop at the substrate. Optionally, pit 20 may be formed previous to formation of the plurality of dielectric layers.

In order to create ledges, etching of the plurality of dielectric layers is done with at least one subsequent etch, whereby the at least one subsequent etch has an etch recipe that is progressively less selective to any given previously formed dielectric layer than to any given subsequently formed dielectric layer. In this manner, a single subsequent etch or a series of etches will cause a "staircase" shape and a multiple-damascene shape to form out of the plurality of dielectric layers. The "staircase" shape forms due to the progressively decreasing selectivity between the first-formed dielectric layer and the last-formed dielectric layer. The "staircase" shape will terminate at a depression in the substrate. In FIG. 7 the depression is pit 20 that includes first dielectric layer 36 and second dielectric layer 38. As illustrated in FIG. 7, the staircase shape is formed by ledge 40 upon the exposed portion of second dielectric layer 38 next to an edge 62 of dielectric layer 36, and by ledge 40 upon the exposed portion of upper surface 24 of substrate 12.

Where an embodiment of the present invention includes two ledges, one above the other, the preferred composite width of the two ledges may be about two-thirds the aforementioned ranges of ledge widths. Where the number of ledges is equal to three, the preferred composite ledge widths may be in a composite width range of about one-half the width range for a single ledge.

Dielectric layer 36 may be in a thickness range from about 1 micron to about 30 microns, preferably from about 1.2 microns to about 15 microns, more preferably from about 1.4 microns to about 10 microns, and most preferably from about 1.6 to about 5 microns. Where there will be two of ledges 40, as illustrated in FIG. 7, the thickness of dielectric layer 36 and second dielectric layer 38 may be about two-thirds the thickness of dielectric layer 36 in the presence of one of ledge 40. Where there is a third of ledge 40, the thickness of dielectric layer 36 etc., may be about one-half the aforementioned thickness of dielectric layer 36 for a single occurrence of ledge 40.

Figure 8:
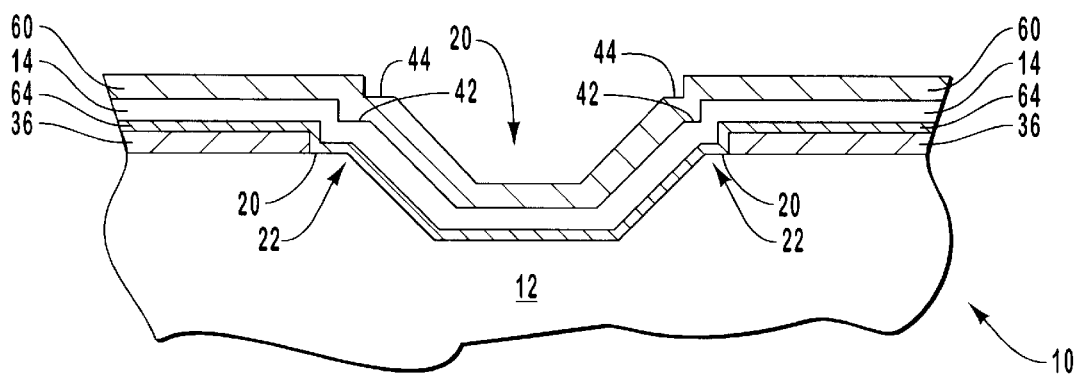
FIG. 8 is an elevational cross-section view of the semiconductor structure depicted in FIG. 5 after further processing, wherein an optional sealing dielectric layer has been formed and wherein a metal layer has been substantially conformably deposited upon the optional sealing dielectric layer. It can also be seen that a masking layer has been formed upon the metal layer according to the present invention, such that formation of a breach in the masking layer is avoided despite the presence of sharp corners forming the edge of the pit.

FIG. 8 illustrates further processing of semiconductor structure 10 as depicted in FIG. 5 or in FIG. 7 after formation of ledge 40 and removal of masking layer 16. A metal layer 14 is formed on dielectric layer 36 of FIG. 5 or upon dielectric layer 38 of FIG. 7. Dielectric layer 36 in FIG. 8 may therefore represent a plurality of dielectric layers as seen in FIG. 7. As such, FIG. 8 is intended to represent further processing of the structures seen in FIGS. 5 and 7.

Where substrate 12 may be electrically conductive or semiconductive, a sealing dielectric layer 64 is used. Preferably, metal layer 14 is formed of a refractory metal, a refractory metal alloy, or other electrically conductive material such as a metal nitride such as TiN or the like or silicides such as TiSi or the like. Preferred refractory metals include metals selected from Group IIIB through VIIIB. More preferred of the refractory metals includes the group consisting of W, Ni, and Ti. Additionally, a preferred composition to form metal layer 14 consists of an intermetallic such as gamma TiAl or the like.

Selection of particular materials to form metal layer 14 will be dependent upon the particular application. Where electrical conductivity is important, better electrical conductors will be selected. Where metal wear is important during multiple repeat testing cycles, a refractory metal that resists wear during multiple contact with BGAs is preferred. Where high-temperature burn-in testing is important to testing of chip packages, an intermetallic such as TiAl may be selected whereby destructive metal flow and/or allotropic phase changes are avoided at the higher temperatures. Additionally, stacks of metals which include a refractory metal on a layer can also be used.

Additionally, metal layer 14 may be formed upon sealing dielectric layer 64 where substrate 12 acts with sealing dielectric layer 64 as an electrically conductive composite. As set forth above, the dielectric layer can form a portion of substrate 12. Additionally, sealing dielectric layer 64 may not be etched to form pit 20, rather it may act as a liner layer within pit 20 upon pit surface 26 and sloping sides 34. A preferred embodiment of metal layer 14 includes a first layer of Ti upon substrate 12, followed by a second layer of TiN and finally followed by a third layer of W. As a composite structure, metal layer 14 consists of a Ti-rich first layer of substantially all Ti, a gradation into $TiN_x$, where $0 \leq x \leq 1$, and a gradation into W that is substantially free of TiN. Alternatively, the third layer may compromise TiAl.

Following the formation of metal layer 14, a masking layer 60 is formed upon metal layer 14. Masking layer 60 will serve as a mask in the formation of metal lines. As it can be seen in FIG. 8, metal layer 14 also forms a metal layer step 42 above ledge 40, and consequently the metal line-forming masking layer 60 forms a masking layer step 44 above metal layer step 42. The formation of ledge 40 and the subsequent formations of metal layer step 42 and masking layer step 44 resists the thinning of metal line-forming masking layer 60 at regions at or above sharp corner 22. It can be appreciated that formation of ledge 40 may be followed by formation of multiple ledges as described above, depending upon the specific application. Masking layer 60 is removed once the metal lines are patterned out of metal layer 14 and etched according to a selected arrangement, resulting in metal lines 58, that may result by way of non-limiting example in the arrangement shown in FIG. 3.

Figure 8A:
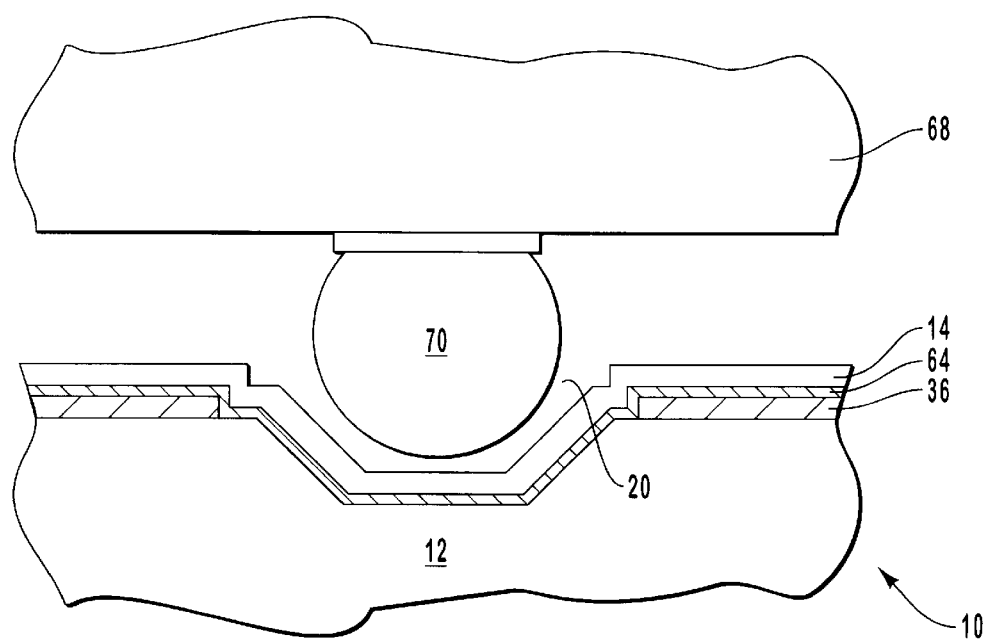
FIG. 8A is an elevational cross-section view of the semiconductor structure depicted in FIG. 8 after further processing, wherein the masking layer has been removed after patterning of the metal layer, and wherein at least one electrically conductive prominence has been inserted within the pit to make electrical contact with the metal layer for testing of the device connected to the electrically conductive prominence.

FIG. 8A illustrates testing of a CSP 68 that includes a solder ball 70. It can be seen that solder ball 70 of CSP 68 has been inserted into pit 20 to make electrical contact with metal layer 14. Were metal layer 14 to be viewed in plan view such as that depicted in FIG. 3, metal layer 14 would include metal line 58 as metal layer 14 leads away from pit 20.

Figure 9:
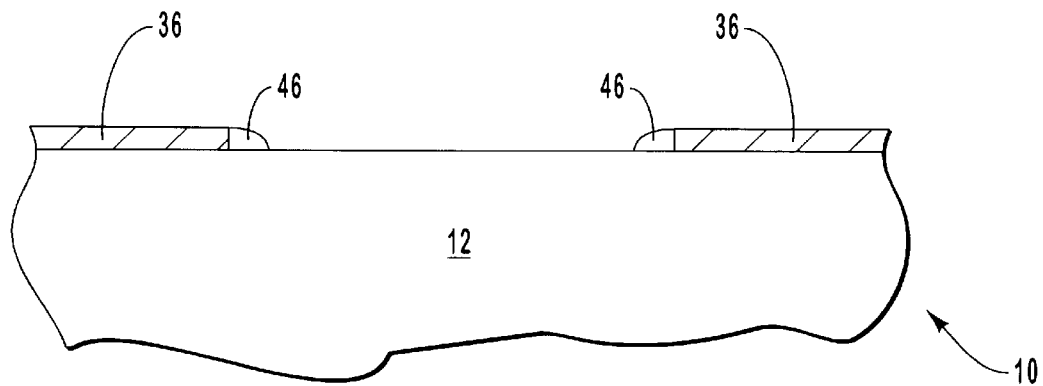
FIG. 9 is an elevational cross-section view of a semiconductor structure, whereby the inventive method of forming a masking layer without a breach is begun by formation of a dielectric layer and a spacer.

In a further embodiment of the present invention, formation of ledge 40 is carried out by the formation of spacer 46 as illustrated in FIG. 9. Dielectric layer 36, which is composed for example of an oxide of silicon, is patterned and etched in order to expose the region of substrate 12 that will correspond to the formation of pit 20 (not shown). A spacer material is deposited upon dielectric layer 36 and conformably upon the region that corresponds to the location of pit 20. A spacer etch follows, whereby spacer 46 remains. Optionally, the spacer etch will double as a pit-forming etch, whereby etch selectivity will be higher for spacer 46 and dielectric layer 36 than for substrate 12. It can be appreciated that dielectric layer 36 may be formed from a plurality of dielectric layers, each of which has chemical qualities that are different from the others, as set forth above.

Figures 10A, 10B:
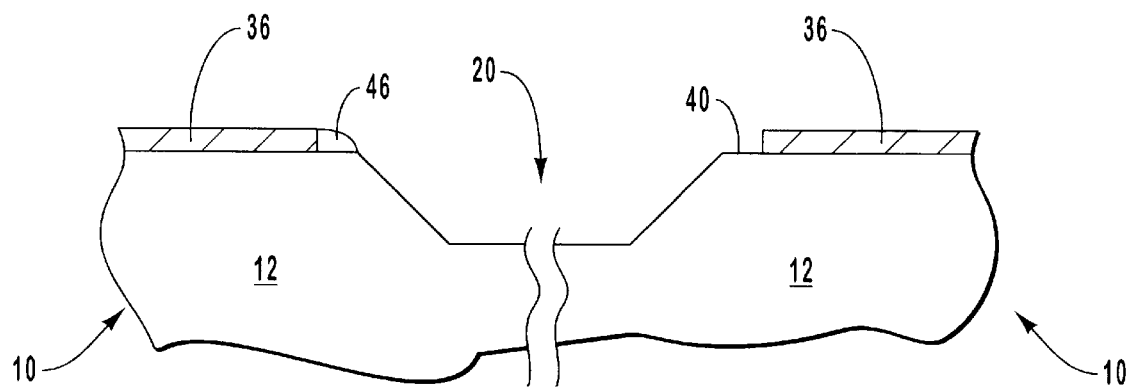
FIG. 10A is an elevational cross-section view of the semiconductor structure depicted in FIG. 9 after further processing, whereby an etch to form the pit has been carried out with an etch recipe such as an anisotropic wet etch that is selective to the oxide layer and to the spacer.
FIG. 10B is an elevational cross-section view of the semiconductor structure depicted in FIG. 10A after further processing, whereby the spacer has been removed with an etch to expose a ledge from a portion of the upper surface of the substrate.

FIG. 10A illustrates the result of an etch into substrate 12, where the etch recipe is selective to spacer 46 and dielectric layer 36. FIG. 10B illustrates semiconductor structure 10 after further processing of semiconductor structure 10 illustrated in FIG. 10A. It can be seen that a subsequent etch that is selective to dielectric layer 36 and to substrate has been carried out to remove spacer 46, thereby exposing ledge 40. Subsequent to exposure of ledge 40, the formation of metal layer 14 (not shown) is carried out and of metal line-forming masking layer 60 (not shown) in order to pattern metal lines.

Figures 11A, 11B:
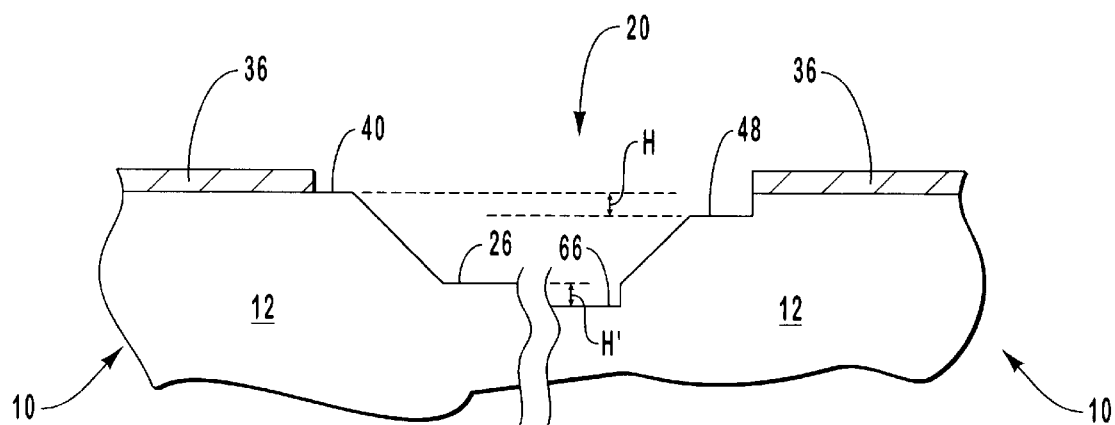
FIG. 11A is an elevational cross-section view of the semiconductor structure depicted in FIG. 9 after further processing according to an alternative embodiment depicted in FIG. 11B whereby a dielectric layer is used as a hard mask followed by an anisotropic dry etch to form a ledge that is lower than the upper surface of the substrate.

Alternatively, formation of spacer 46 can be carried out substantially by beginning as set forth above. Formation of spacer 46 is carried out as illustrated in FIGS. 9 and 10A. Following formation of spacer 46, a substantially anisotropic etch is carried out that may be selective to dielectric layer 36. The structure illustrated in FIG. 11A is substantially identical to that in FIG. 10B. The removal of spacer 46 and an etch that follows causes pit 20, seen in FIG. 11B, to form at a lower level than pit surface 26 of substrate 12 seen in FIG. 11A.

FIG. 11A is analogous to FIG. 10B, whereby spacer 46 has been removed after a pit-forming etch. FIG. 11B illustrates the effect of the removal of spacer 46 after which a ledge-forming and pit-deepening etch creates a lower ledge 48 and a lower pit surface 66. By comparing FIGS. 11A and 11B, it can be seen that lower pit surface 66 of substrate 12 in FIG. 11B is lower than pit surface 26 of substrate 12 in FIG. 11A by a distance of H'. Additionally, FIG. 11B illustrates the formation of lower ledge 48, at a distance of H below the level of ledge 40 as illustrated in FIG. 11A. Distances H' and H may be substantially the same. Accordingly, lower ledge 48 has a level that is beneath upper surface 24 of substrate 12.

At this point, dielectric layer 36 may be removed or it may be left upon upper surface 24 of substrate 12 before the formation of optional sealing dielectric layer 64, metal layer 14, and masking layer 16, depending upon the preferred application.

Comparison of FIG. 11A to FIG. 11B illustrates this embodiment of the invention. FIG. 11A has a single-depth depression in substrate 12 to form pit 20. FIG. 11B has a two-level depression formed into substrate 12 that makes up pit 20. The two-level depression in substrate 12 include a first level comprising lower ledge 48 and a second level comprising lower pit surface 66. Thus, a dual-damascene pit structure comprising pit 20 is illustrated in both FIG. 11A and FIG. 11B. Where dielectric layer 36 may be removed, the depression in substrate 12 that would form pit 20 in FIG. 11B comprises a dual-damascene depression in substrate 12.

Figure 11C:
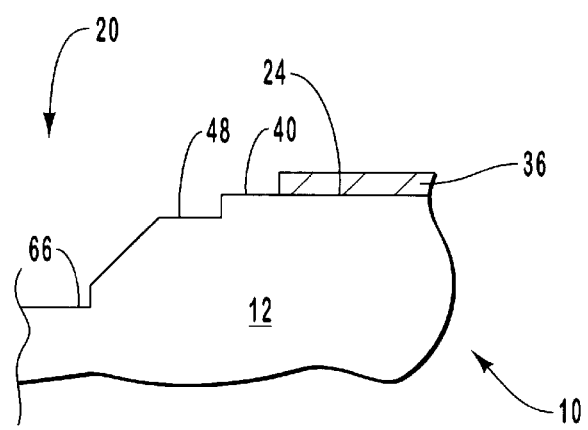
FIG. 11C illustrates the formation of a triple-damascene depression that includes a lower ledge in the semiconductor substrate and a ledge thereupon by the formation of a dielectric layer.

It can now be appreciated that a combination of ledge 40 and lower ledge 48 may occur by varying the configuration of semiconductor structure 10 as depicted in FIG. 11B. Dielectric layer 36 may be entirely removed to form the dual-damascene depression in substrate 12 as illustrated in FIG. 11B. Additionally, combination of ledge 40 and lower ledge 48 is created by allowing dielectric layer 36 to be sufficiently thick so that an isotropic etch of dielectric layer 36 causes recession thereof away from lower ledge 48 to form ledge 40 as illustrated in FIG. 11C. Additionally, the formation of ledge 40 may be formed by patterning a masking layer upon dielectric layer 36 sufficient to expose and remove that portion of dielectric layer 36 that forms ledge 40. Thus, the combination of lower pit surface 66, lower ledge 48, and ledge 40 forms a triple-damascene depression that comprises pit 20. Hence, removal of dielectric layer 36 results in a dual-damascene depression made entirely of substrate 12. It can now be appreciated that a triple-damascene structure can be made by performing a second anisotropic etch upon semiconductor structure 10, illustrated in FIG. 11C, wherein dielectric layer 36 is used as a hard mask, and whereby the levels of lower pit surface 66, lower ledge 48, and ledge 40 will all result in lower levels, and upper surface 24 of substrate will have a new ledge next to ledge 40.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. A method of forming a semiconductor testing device comprising:

providing a substrate having an upper surface;

forming a depression in said upper surface;

forming a dielectric first layer upon said upper surface and extending continuously thereon within said depression;

removing said dielectric first layer within said depression and from a portion of said upper surface adjacent to said depression; and forming an electrically conductive film upon said dielectric first layer and extending continuously upon said portion of the upper surface adjacent to said depression and within said depression.

2. A method of forming a semiconductor testing device according to claim 1, wherein removing said dielectric first layer comprises:

anisotropically etching said dielectric first layer with an etch recipe that is more selective to said substrate than to said dielectric first layer.

3. A method of forming a semiconductor testing device according to claim 1, further comprising:

forming a masking layer upon said electrically conductive film; and selectively removing said electrically conductive film to form an electrical contact upon said dielectric first layer and extending continuously upon said upper surface of said depression.

4. A method of forming a semiconductor device according to claim 1, wherein said electrically conductive film comprises a refractory metal.

5. A method of forming a semiconductor testing device according to claim 1, wherein said electrically conductive film is selected from Group IIIB through VIIIB metals.

6. A method of forming a semiconductor testing device according to claim 1, wherein said electrically conductive film is selected Group VIIIB metals.

7. A method of forming a semiconductor testing device according to claim 1, wherein said electrically conductive film is selected from W and Ti.

8. A method of forming a semiconductor testing device according to claim 1, wherein said electrically conductive film is Ni.

9. A method of forming a semiconductor testing device according to claim 1, wherein said electrically conductive film comprises TiAl.

10. A method of forming a semiconductor testing device according to claim 1, wherein said electrically conductive film comprises:

a first layer of Ti upon said substrate;

a second layer of TiN upon said first layer;
a third layer of W upon said second layer.

11. A method of forming a semiconductor testing device comprising:
  providing a substrate having an upper surface;
  forming a depression in said upper surface;
  forming a dielectric first layer upon said upper surface and extending continuously thereon within said depression;
  removing said dielectric first layer within said depression and from a portion of said upper surface adjacent to said depression by etching said dielectric first layer with an etch recipe that is more selective to said substrate than to said dielectric first layer;
  forming an electrically conductive film composed of a refractory metal upon said dielectric first layer and extending continuously upon said portion of the upper surface adjacent to said depression and within said depression;
  forming a masking layer upon said electrically conductive film; and
  selectively removing said electrically conductive film to form an electrical contact upon said dielectric first layer and extending continuously upon said upper surface of said depression.

12. A method of forming a semiconductor testing device comprising:
  forming a dielectric first layer upon an upper surface of a substrate;
  removing a portion of said dielectric first layer to expose said upper surface of said substrate;
  forming a spacer upon said upper surface and upon said dielectric first layer;
  forming a depression into said substrate adjacent said spacer;
  removing said spacer to expose a portion of said upper surface adjacent to said depression; and
  forming an electrically conductive film upon said dielectric first layer and extending continuously upon said portion of the upper surface adjacent to said depression and within said depression;
  forming a masking layer upon said electrically conductive film; and
  selectively removing said electrically conductive film to form an electrical contact upon said dielectric first layer and extending continuously upon a surface within the depression.

13. The method as defined in claim 12, wherein said portion of said upper surface adjacent to said depression is adjacent to said dielectric first layer.

14. A method of forming a semiconductor testing device according to claim 12, wherein removing a portion of said dielectric first layer comprises:
  anisotropically etching said dielectric first layer with an etch recipe that is more selective to said substrate than to said dielectric first layer.

15. A method of forming a semiconductor testing device according to claim 12, wherein said electrically conductive film comprises a refractory metal.

16. A method of forming a semiconductor testing device according to claim 12, wherein said electrically conductive film is selected from Group IIIB through VIIIB metals.

17. A method of forming a semiconductor testing device according to claim 12, wherein said electrically conductive film is selected from Group VIIIB metals.

18. A method of forming a semiconductor testing device according to claim 12, wherein said electrically conductive film is selected from W and Ti.

19. A method of forming a semiconductor testing device according to claim 12, wherein said electrically conductive film is Ni.

20. A method of forming a semiconductor testing device according to claim 12, wherein said electrically conductive film comprises TiAl.

21. A method of forming a semiconductor testing device according to claim 12, wherein said electrically conductive film comprises:
  a first layer of Ti upon said substrate;
  a second layer of TiN; and
  a third layer of W.

22. A method of forming a semiconductor testing device comprising:
  forming a dielectric first layer upon an upper surface of a substrate;
  removing a portion of said dielectric first layer to expose a first portion of said upper surface of said substrate;
  forming a spacer upon at least some of said first portion of said upper surface and upon said dielectric first layer; and
  removing said spacer and at least some of said first portion of said upper surface to form a depression in said substrate including:
    a ledge beneath said upper surface of said substrate; and
    a pit surface beneath said ledge and said upper surface of said substrates forming an electrically conductive film upon said upper surface of said substrate and extending continuously upon said ledge and within said depression upon said pit surface;
  forming a masking layer upon said electrically conductive film; and
  selectively removing said electrically conductive film to form an electrical contact upon said dielectric first layer and extending continuously upon said upper surface of said substrate.

23. The method as defined in claim 22, wherein the ledge and the pit surface are planar and parallel to each other.

24. A method of forming a semiconductor testing device according to claim 22, wherein removing a portion of said dielectric first layer comprises:
  anisotropically etching said dielectric first layer with an etch recipe that is more selective to said substrate than to said dielectric first layer.

25. A method of forming a semiconductor device according to claim 22, wherein said electrically conductive film comprises a refractory metal.

26. A method of forming a semiconductor testing device according to claim 22, wherein said electrically conductive film is selected from the group consisting of Group IIIB through VIIIB metals.

27. A method of forming a semiconductor testing device according to claim 22, wherein said electrically conductive film is selected from the group consisting of Group VIIIB metals.

28. A method of forming a semiconductor testing device according to claim 22, wherein said electrically conductive film is selected from the group consisting of W and Ti.

29. A method of forming a semiconductor testing device according to claim 22, wherein said electrically conductive film is Ni.

30. A method of forming a semiconductor testing device according to claim 22, wherein said electrically conductive film comprises TiAl.

31. A method of forming a semiconductor testing device according to claim 22, wherein said electrically conductive film comprises:

a first layer of Ti upon said substrate;
a second layer of TiN; and
a third layer of W.

32. A method of forming a semiconductor testing device comprising:
   forming a dielectric first layer upon an upper surface of a substrate;
   anisotropically etching said dielectric first layer with an etch recipe that is more selective to said substrate than to said dielectric first layer to expose a first 5 portion of said upper surface of said substrate;
   forming a spacer upon at least some of said first portion of said upper surface and upon said dielectric first layer;
   forming a depression in said substrate adjacent said spacer;
   removing said spacer and at least some of said first portion of said upper surface to form a depression in said substrate including:
      a planar ledge beneath said upper surface of said substrate; and
      a planar pit surface beneath said ledge and said upper surface of said substrate, the ledge and the pit surface being parallel to each other;
   anisotropically etching said substrate forming a Ti layer upon said upper surface;
   forming a TiN layer upon said Ti layer; and
   forming a W layer upon said TiN layer and extending continuously upon said ledge and said pit surface.

33. A method of forming a semiconductor testing device according to claim 32, following removing said spacer, further comprising:
   removing a portion of said dielectric first layers to expose a second planar ledge above said planar ledge upon said upper surface.

34. A method of forming a semiconductor testing device comprising:
   forming in succession, a plurality of dielectric layers on a substrate, the substrate having an upper surface, each subsequent dielectric layer having a composition different from the previous dielectric layers adjacent thereto;
   performing a first etching process through said plurality of dielectric layers to expose said upper surface of said substrate;
   performing a second etching process through said plurality of dielectric layers with an etch recipe that is more selective to some of said plurality of dielectric layers than to other of said plurality dielectric layers, wherein at least one of said first and second etching processes forms a depression in said substrate; and
   forming an electrically conductive film upon said upper surface and extending continuously upon said plurality of said dielectric layers to a surface within said depression;
   forming a masking layer upon said electrically conductive film; and
   selectively removing said electrically conductive film to form an electrical contact upon said plurality of dielectric layers and extending continuously upon said surface within said depression.

35. A method of forming a semiconductor testing device according to claim 34, wherein at least one of said first and second etching processes is more selective to said substrate.

36. A method of forming a semiconductor testing device according to claim 34, wherein one of said first and second etching processes is an isotropic etch and the other of said first and second etching processes is an isotropic etch.

37. A method of forming a semiconductor testing device comprising:
   providing a substrate having an upper surface;
   forming a dielectric first layer on the upper surface of the substrate;
   forming a dielectric second layer on the dielectric first layer;
   selectively removing said dielectric first layer and said dielectric second layer to expose at least a portion of said upper surface of said substrate;
   forming a depression in said substrate adjacent to the at least a portion of said upper surface of the substrate, said depression having a top surface;
   etching the dielectric first layer and the dielectric second layer with an etch recipe that is more selective to the dielectric first layer that to the dielectric second layer;
   forming a metal layer upon the dielectric second layer and extending continuously upon the dielectric first layer and upon the at least a portion of said upper surface of the substrate, and upon the top surface of the depression,
   forming a masking layer upon said metal layer; and
   selectively removing said metal layer to form an electrical contact upon said dielectric first and second layers and extending continuously upon the top surface of the depression.

38. A method of forming a semiconductor testing device comprising:
   providing a semiconductor substrate having an upper surface;
   forming a plurality of dielectric layers sequentially upon the semiconductor substrate, each dielectric layer having a composition different from the dielectric layers adjacent thereto;
   performing a first etching process through said plurality of dielectric layers to expose at least a portion of said upper surface of said semiconductor substrate;
   performing a second etching process upon the semiconductor substrate to form a depression therein extending beneath the upper surface of the semiconductor substrate, wherein there is a breach in each dielectric layer of said plurality of dielectric layers, each said breach having a width, wherein the width of the dielectric layer adjacent to said upper surface of the semiconductor substrate is less than the width of the other of said breaches and wherein the width of each breach is greater than the width of the breach that is adjacent thereto and that is closer to said substrate; and
   forming a conductive layer extending continuously upon:
      each dielectric layer of said plurality of dielectric layers;
      the exposed portion of the upper surface of the semiconductor substrate; and
      the depression in the semiconductor substrate, forming a masking layer upon said conductive layer; and
   selectively removing said conductive layer to form an electrical contact upon said plurality of dielectric layers and extending continuously upon the depression in the semiconductor substrate.

39. A method of forming a semiconductor testing device according to claim 38, before forming a conductive layer, further comprising:
   forming a dielectric layer over said depression.

* * * * *

UNITED STATES PATENT AND TRADEMARK OFFICE
CERTIFICATE OF CORRECTION

PATENT NO. : 6,169,021 B1
DATED : January 2, 2001
INVENTOR(S) : Salman Akram; John R. C. Futrell; Steven M. McDonald It is certified that error appears in the above-identified patent and that said Letters Patent is hereby corrected as shown below:

Column 1,
Line 15, after "trenches and pits" insert -- , -- (comma)

Column 2,
Line 27, after "BGA package" change "become" to -- becomes --
Line 55, after "form metal lines" change "(now" to -- (not --

Column 4,
Line 33, after "mask" insert -- , -- (comma)

Column 5,
Line 2, after "11B" insert -- , -- (comma)
Line 32, after "formed at the end of" insert -- the --

Column 6,
Line 38, after "Any combination of" insert -- a --
Line 54, after "but may not" insert -- be --

Column 9,
Line 4, after "and to substrate" insert -- 12 --
Line 42, after "substrate 12" change "include" to -- includes --

Column 10,
Line 5, after "surface 24 of substrate" insert -- 12 --
Line 54, afer "film is selected" insert -- from --

UNITED STATES PATENT AND TRADEMARK OFFICE
CERTIFICATE OF CORRECTION

PATENT NO.   : 6,169,021 B1
DATED        : January 2, 2001
INVENTOR(S)  : Salman Akram; John R. C. Futrell; Steven M. McDonald It is certified that error appears in the above-identified patent and that said Letters Patent is hereby corrected as shown below:

Column 11,
Line 36, after "to said depression;" delete [and]

Column 12,
Line 27, after "of said" change "substrates" to -- substrate; -- and begin a new paragraph Column 13,
Line 10, after "expose a first" delete [5]
Line 25, after "etching said substrate" insert -- ; -- (semicolon) and begin new paragraph
Line 48, after "said plurality" insert -- of --
Line 50, after "substrate;" delete [and]

Column 14,
Line 17, after "dielectric first layer" change "that" to -- than --
Line 56, after "semiconductor substrate" change "," (comma) to -- ; -- (semicolon) and begin new paragraph Signed and Sealed this Eighteenth Day of December, 2001

*Attest:*

NICHOLAS P. GODICI
*Attesting Officer*     Acting Director of the United States Patent and Trademark Office